United States Patent
Gopalan et al.

(10) Patent No.: US 10,106,699 B2
(45) Date of Patent: *Oct. 23, 2018

(54) INIMER-CONTAINING RANDOM COPOLYMERS AND CROSSLINKED COPOLYMER FILMS FOR DENSE POLYMER BRUSH GROWTH

(71) Applicant: Wisconsin Alumni Research Foundation, Madison, WI (US)

(72) Inventors: Padma Gopalan, Madison, WI (US); Daniel P. Sweat, Madison, WI (US); Myungwoong Kim, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 525 days.

This patent is subject to a terminal disclaimer.

(21) Appl. No.: 14/168,383

(22) Filed: Jan. 30, 2014

(65) Prior Publication Data

US 2014/0235755 A1  Aug. 21, 2014

Related U.S. Application Data

(62) Division of application No. 13/771,922, filed on Feb. 20, 2013, now abandoned.

(51) Int. Cl.
| | |
|---|---|
| *C09D 133/08* | (2006.01) |
| *C08F 20/22* | (2006.01) |

(Continued)

(52) U.S. Cl.
CPC .......... *C09D 133/08* (2013.01); *C08F 12/16* (2013.01); *C08F 14/16* (2013.01); *C08F 20/22* (2013.01); *C08F 20/32* (2013.01); *C08F 214/16* (2013.01); *C08F 220/22* (2013.01); *C08F 220/32* (2013.01); *C08F 293/005* (2013.01);

(Continued)

(58) Field of Classification Search
CPC .......... C08F 12/16; C08F 14/16; C08F 20/22; C08F 20/32; C08F 220/22; C08F 220/32; C08F 214/16; C08F 293/005; C08F 2438/01; C09D 133/14; C09D 133/16; C09D 133/068; C08L 33/14; C08L 33/16; C08L 33/068; C08L 2312/00;

(Continued)

(56) References Cited

U.S. PATENT DOCUMENTS

| | | | |
|---|---|---|---|
| 7,744,803 B2 * | 6/2010 | Jackson | C08J 3/243 264/477 |
| 9,097,979 B2 * | 8/2015 | Gopalan | G03F 1/50 |

(Continued)

OTHER PUBLICATIONS

Sigma-Aldrich Poly(glydicyl methacrylate) Product Specification (no date).*

(Continued)

*Primary Examiner* — Kregg T Brooks
(74) *Attorney, Agent, or Firm* — Bell & Manning, LLC

(57) ABSTRACT

Crosslinkable random copolymers comprising atom transfer radical polymerization (ATRP) initiators and crosslinked copolymer films formed from the copolymers are provided. The random copolymers, which are polymerized from one or more alkyl halide functional inimers and one or more monomers having a crosslinkable functionality, are characterized by pendant ATRP initiating groups and pendant crosslinkable groups.

9 Claims, 8 Drawing Sheets

(51) Int. Cl.
| | |
|---|---|
| *C08F 14/16* | (2006.01) |
| *C09D 133/16* | (2006.01) |
| *C09D 133/14* | (2006.01) |
| *C08J 5/18* | (2006.01) |
| *C08F 12/16* | (2006.01) |
| *C08F 20/32* | (2006.01) |
| *C08F 220/32* | (2006.01) |
| *C08F 220/22* | (2006.01) |
| *C08F 293/00* | (2006.01) |
| *C08F 214/16* | (2006.01) |

(52) U.S. Cl.
CPC .............. *C08J 5/18* (2013.01); *C09D 133/14* (2013.01); *C09D 133/16* (2013.01); *B81C 2201/0149* (2013.01); *B81C 2201/0156* (2013.01); *C08F 2438/01* (2013.01); *C08J 2333/14* (2013.01); *C08L 2312/00* (2013.01)

(58) Field of Classification Search
CPC ...... B81C 2201/0149; B81C 2201/0156; C08J 2333/14
See application file for complete search history.

(56) References Cited

U.S. PATENT DOCUMENTS

| | | | |
|---|---|---|---|
| 2008/0045686 A1* | 2/2008 | Meagher ................ | C08J 7/123 526/329.7 |
| 2009/0087664 A1* | 4/2009 | Nealey ................ | B81C 1/00031 428/411.1 |
| 2010/0036055 A1* | 2/2010 | Hayashi .................. | C08F 2/20 525/70 |
| 2014/0272673 A1 | 9/2014 | Gopalan et al. | |

OTHER PUBLICATIONS

Feng et al., "Surface-Initiated Atom Transfer Radical Polymerization of Oligo(ethylene glycol) Methacrylate: Effect of Solvent on Graft Density", Macromol. Rapid Commun. 2005, 26, 1383-1388.*

Tsujii et al., "Fabrication of Patterned High-Density Polymer Graft Surfaces. II. Application of EB-Patterned Initiator Monolayer by Surface Initiated Atom Transfer Radical Polymerization," Polymer 43 (2002) 3837-3841.*

Coad, et al., "A Substrate-Independent Method for Surface Grafting Polymer Layers by Atom Transfer Radical Polymerization: Reduction of Protein Adsorption," *Acta Biomaterialia*, 2012, 8, pp. 608-618.

Harrison, et al., "Lithography with a Mask of Block Copolymer Microstructures," *J. Vac. Sci. Technol. B.*, Mar./Apr. 1998, 16(2), Intro Page & pp. 544-552.

In, et al., "Side-Chain-Grafted Random Copolymer Brushes as Neutral Surfaces for Controlling the Orientation of Block Copolymer Microdomains in Thin Films," *Langmuir*, 2006, 22, pp. 7855-7860.

Ryu, et al., "Surface Modification with Cross-Linked Random Copolymers: Minimum Effective Thickness," *Macromolecules*, 2007, 40, pp. 4296-4300.

Yameen, et al., "Surface Initiated Polymerization on Pulsed Plasma Deposited Polyallylamine: A Polymer Substrate-Independent Strategy to Soft Surfaces with Polymer Brushes," *Macromol. Rapid Commun.*, 2011, 32, pp. 1735-1740.

Notice of Allowance for U.S. Appl. No. 13/800,178, mailed on Apr. 2, 2015, 17 pp.

Coad, Bryan R., et al., A substrate-independent method for surface grafting polymer layers by atom transfer radical polymerization: Reduction of protein adsorption, Acta Biomaterialia 8, Oct. 11, 2011, pp. 608-618.

Coad, Bryan R., et al., Substrate-Independent Method for Growing and Modulating the Density of Polymer Brushes from Surfaces by ATRP, ACS Appl. Mater. Interfaces, Apr. 19, 2012, pp. 2811-2823.

Liu, Yi-Yu, et al., Facile Surface Immobilization of ATRP Initiators on Colloidal Polymers for Grafting Brushes and Application to Colloidal Crystals, Langmuir 27(3), Jan. 7, 2011, pp. 1168-1174.

Martina, Alberto Della, et al., Surface functionalization of crosslinked poly(dicyclopentadiene), Reactive & Functional Polymers 57, Nov. 1, 2003, pp. 49-55.

Barbey, Raphael, et al., Polymer Brushes via Surface-Initiated Controlled Radical Polymerization: Synthesis, Characterization, Properties, and Applications, Chem. Rev., Oct. 21, 2009, pp. 5437-5527.

* cited by examiner

INIMER-CONTAINING RANDOM COPOLYMERS AND CROSSLINKED COPOLYMER FILMS FOR DENSE POLYMER BRUSH GROWTH

CROSS-REFERENCE TO RELATED APPLICATIONS

The present application is a divisional of U.S. patent application Ser. No. 13/771,922 that was filed Feb. 20, 2013, the entire contents of which is hereby incorporated by reference.

REFERENCE TO GOVERNMENT RIGHTS

This invention was made with government support under 0832760 awarded by the National Science Foundation. The government has certain rights in the invention.

BACKGROUND

Polymer brushes are a broad class of materials consisting of a polymer chain tethered by one chain end to a surface. These brushes have a variety of applications especially in their ability to tune and modify surface properties such as bioadhesion, wettability, and surface activity. Two main methods for their preparation have emerged, namely grafting "to" and grafting "from". The grafting "to" methodology involves the reaction of an end-functionalized polymer chain with an appropriate surface to anchor the polymer. Although grafting "to" allows for full characterization of the polymer before grafting, it is only applicable to limited substrates, requires terminal functionality on the polymer chain-end, and the grafting efficiency decreases with increasing molecular weight.

Grafting "from" overcomes some of these limitations and has been used with a variety of polymerization techniques. By anchoring a suitable initiator to the substrate, polymer chains can be grown directly by the use of these various polymerization techniques. The majority of surface-anchored initiators involve the formation of a self-assembled monolayer (SAM) on an appropriate substrate. However, SAMs have limited stability to various reagents and are not substrate-independent.

Surface-initiated atom transfer radical polymerization (SI-ATRP) has become the workhorse in the grafting "from" literature due to the ease in polymerizing a wide variety of monomers containing an array of functional groups with a high degree of control. Control in ATRP comes from the reversible redox activation of a dormant polymer chain-end (halide functionalized) by a halogen transfer to a transition metal complex. Many parameters are involved which can be tuned for better control, which provides an impressive window in which well-controlled polymers of numerous different monomers can be synthesized.

While the most common method for anchoring ATRP initiators to the substrate involves the formation of a SAM, some alternative methods have been presented in the literature. von Werne et al. describe the inclusion of 10~20% ATRP inimer in a mixture of curable monomers suitable for photopolymerization. (See, von Werne, T. A.; Germack, D. S.; Hagberg, E. C.; Sheares, V. V.; Hawker, C. J.; Carter, K. R., A Versatile Method for Tuning the Chemistry and Size of Nanoscopic Features by Living Free Radical Polymerization. *J. Am. Chem. Soc.* 2003, 125, 3831-3838.) This work was further extended by the use of an acid-cleavable ATRP inimer, allowing for direct measurement of surface grown brushes and their comparison with polymer grown from sacrificial initiator in solution. (See, Koylu, D.; Carter, K. R., Stimuli-Responsive Surfaces Utilizing Cleavable Polymer Brush Layers. *Macromolecules* 2009, 42, 8655-8660.) An alternate method for creating an inimer layer is to form an adhesive coating which contains moieties for initiator incorporation. For example, layers of poly(allylamine) (deposited by pulsed plasma polymerization) or catechol-amine (deposited by solution incubation) on various substrates were used for functionalizing the surface with ATRP initiators. (See, Yameen, B.; Khan, H. U.; Knoll, W.; Förch, R.; Jonas, U., Surface Initiated Polymerization on Pulsed Plasma Deposited Polyallylamine: A Polymer Substrate-Independent Strategy to Soft Surfaces with Polymer Brushes. *Macromol. Rapid Commun.* 2011, 32, 1735-1740, Coad, B. R.; Lua, Y.; Meagher, L., A Substrate-Independent Method for Surface Grafting Polymer Layers by Atom Transfer Radical Polymerization: Reduction of Protein Adsorption. *Acta Biomaterialia* 2012, 8, 608-618, Fan, X.; Lin, L.; Dalsin, J. L.; Messersmith, P. B., Biomimetic Anchor for Surface-Initiated Polymerization from Metal Substrates. *J. Am. Chem. Soc.* 2005, 127, 15843-15847.) More recently, a catechol-functionalized methacrylamide and a methacrylate ATRP inimer were copolymerized by free radical polymerization followed by deposition on Ti substrates for polymer brush growth. (See, Wang, X.; Ye, Q.; Gao, T.; Liu, J.; Zhou, F., Self-Assembly of Catecholic Macroinitiator on Various Substrates and Surface-Initiated Polymerization. *Langmuir* 2012, 28, 2574-2581.)

SUMMARY

Crosslinkable random copolymers and crosslinked copolymer films formed from the copolymers are provided. The copolymers and copolymer films comprise functional groups that are ATRP initiators. Methods for forming the crosslinked films and for using the crosslinked films for polymer brush growth and for the self-assembly of block copolymers films are also provided.

One embodiment of a random copolymer comprises a copolymer of a first monomer comprising an alkyl halide functional group that is capable of acting as an ATRP initiator and a second monomer comprising a crosslinkable functional group, wherein alkyl halide functional groups and the crosslinkable functional groups are pendant groups on the backbone of the random copolymer. The first monomer may be selected from acrylate monomers having an alkyl halide functional group, methacrylate monomers having an alkyl halide functional group, styrene monomers having an alkyl halide functional group, and combinations thereof One embodiment of a crosslinked copolymer film comprises crosslinked random copolymer chains, wherein the random copolymer is a copolymer of a first monomer comprising an alkyl halide functional group that is capable of acting as an ATRP initiator, and a second monomer, and further wherein the alkyl halide functional groups are pendant groups on the backbone of the random copolymer chains and the crosslinks between the random copolymer chains are formed between crosslinkable functional groups on the second monomers.

One embodiment of a method of making a crosslinked copolymer film comprises the steps of: depositing a film of a random copolymer on a substrate surface, wherein the random copolymer is a copolymer of a first monomer comprising an alkyl halide functional group that is capable of acting as an ATRP initiator and a second monomer comprising a crosslinkable functional group, and further wherein the alkyl halide functional groups and the crosslinkable groups are pendant groups on the backbone of the random copolymer chains; and subsequently crosslinking the crosslinkable functional groups, such that crosslinks are formed between the random copolymer chains in the film.

One embodiment of a method of making a polymer brush using the crosslinked copolymer films comprises the steps of: exposing the copolymer film to a solution comprising polymerizable monomers and a transition metal complex under reaction conditions in which the halides of the copolymer film initiate the polymerization of the polymerizable monomers via atom transfer radical polymerization.

One embodiment of a method of forming a self-assembled block copolymer film comprises the steps of depositing a block copolymer film on a patterned substrate, wherein the patterned substrate induces the block copolymer to self-assemble into patterned domains. The patterned substrate comprises a first set of surface regions and a second set of surface regions. The first set of surface regions comprises a polymer brush disposed on a crosslinked copolymer film, the film comprising crosslinked random copolymer chains, wherein the random copolymer is a copolymer of a first monomer comprising an alkyl halide functional group and a second monomer, and further wherein the alkyl halide functional groups are pendant groups on the backbone of the random copolymer chains in the film and the crosslinks between the random copolymer chains in the film are formed between crosslinkable functional groups on the second monomers.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Crosslinkable random copolymers comprising ATRP initiators and crosslinked copolymer films formed from the copolymers are provided. Also provided are methods of synthesizing the random copolymers and the films. The crosslinked films may be used for polymer brush growth via SI-ATRP and the resulting polymer brushes may be patterned and used as substrates for the self-assembly of block copolymers films.

The random copolymers, which are polymerized from one or more alkyl halide functional inimers and one or more monomers having a crosslinkable functionality, are characterized by pendant ATRP initiating groups and pendant crosslinkable groups. By adjusting the ratio of inimer to crosslinkable monomer and/or by polymerizing additional comonomers in the random copolymers, the inimer content of the copolymers can be varied over a broad range. Thus, the copolymers can be synthesized with very high halogen atom contents. When such copolymers are crosslinked into a copolymer film, the films are suited for use as grafting substrates for densely grown polymer brushes. The crosslinked films are stable on a broad ranges of substrate materials, even in the absence of covalent bonding to the substrate and in the presence of destabilizing organic solvents.

Figure 1:
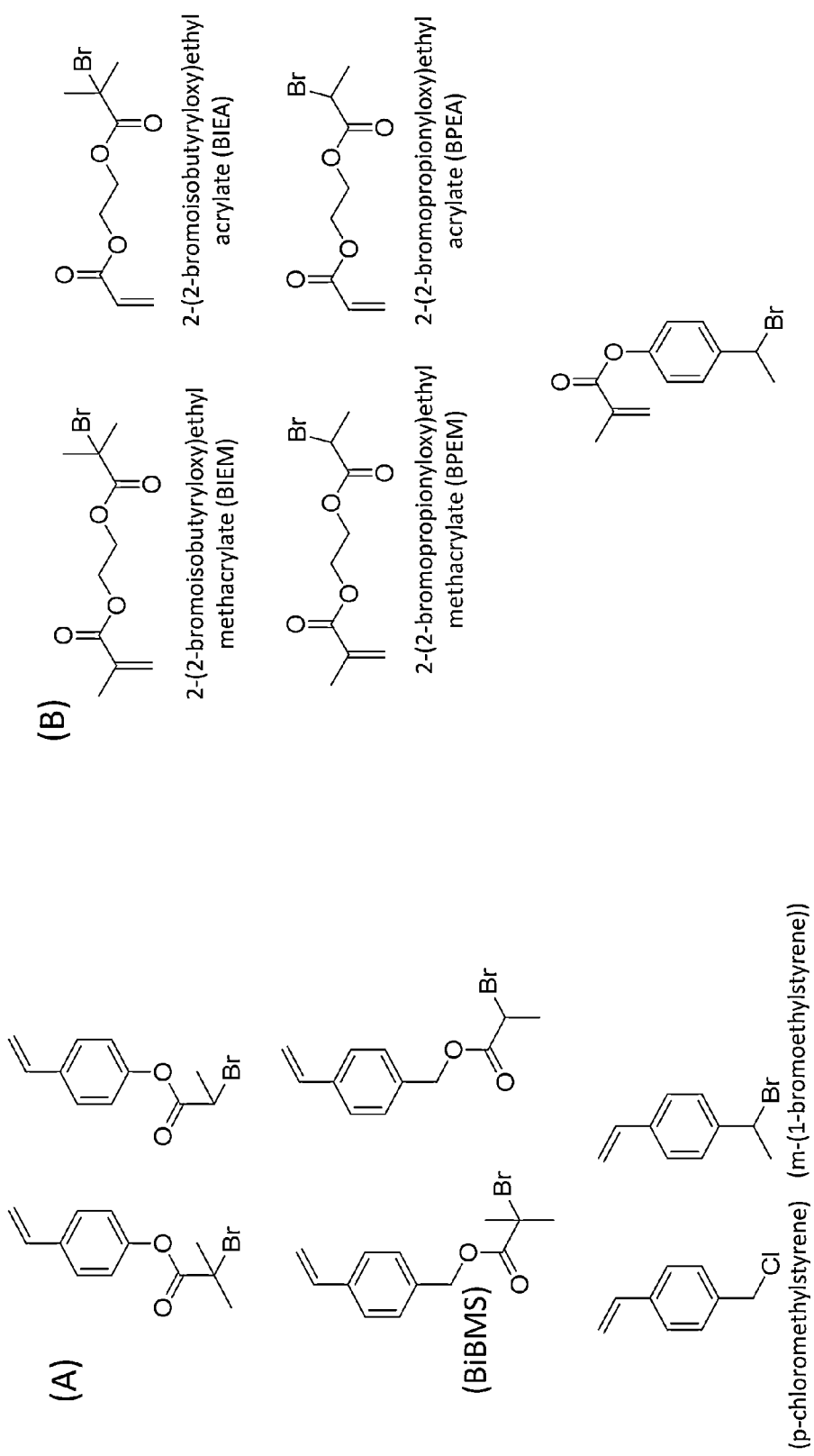
FIG. 1. (A) Structures of some styrene-based inimers; and (B) structures of some (meth)acrylate-based inimers.

The inimers used to synthesize the copolymers comprise an ATRP initiating group and a monomer fragment. The ATRP initiating groups comprise alkyl halide groups, including secondary and tertiary alkyl halides. The monomer fragment is a portion of the inimer having a functional group that is polymerized into the copolymer backbone chain. Suitable monomer fragments include acrylates and methacrylates (collectively "(meth)acrylates") and styrenes. Thus, the inimers generally comprise alkyl halide group-containing ethylenically unsaturated monomers. P-(2-bromoisobutyloylmethyl)styrene (BiBMS) is one example of a suitable inimer. The structure of this inimer, along with the structures and names of other suitable styrene-based inimers, is shown in FIG. 1(A). The structures and names of some suitable (meth)acrylate-based inimers are shown in FIG. 1(B).

Figure 2:
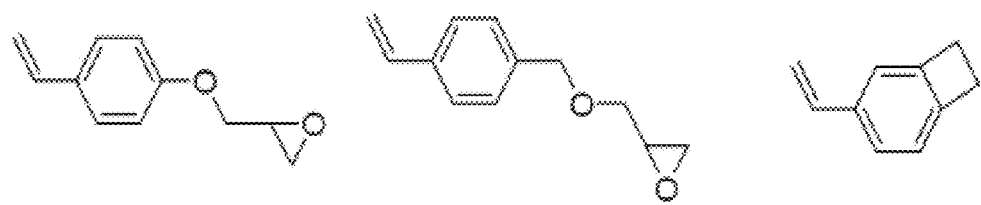
FIG. 2. (A) Structures of some (meth)acrylate-based crosslinkable monomers; and (B) structures of some styrene-based crosslinkable monomers.
Figure 2:
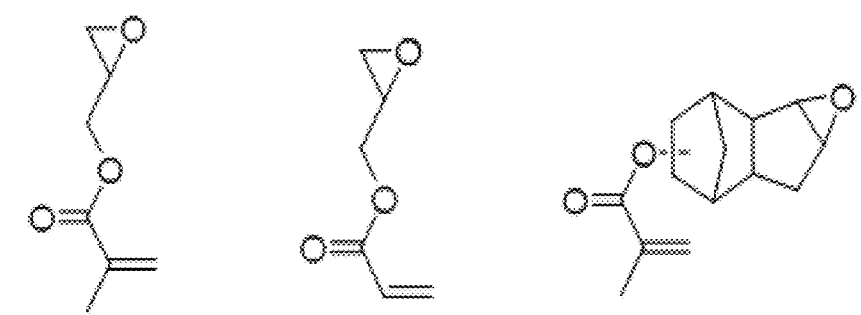

The crosslinkable monomers employed as comonomers in the polymer synthesis comprise a crosslinkable functional group and a monomer fragment. The crosslinkable functional groups may be thermally crosslinkable groups (i.e., wherein crosslinking is induced by heating) or photocrosslinkable groups (i.e., wherein crosslinking is induced by radiation), such as UV-crosslinkable groups. However, because radiations, such as UV radiation, can remove the halogen atoms from the initiating groups, thermally crosslinkable inimers may be preferred. Epoxy groups are an example of a suitable crosslinkable group. Like the monomer fragment of the inimer, the monomer fragment of the crosslinkable monomer may comprise a styrene group or a (meth)acrylate group. One example of a suitable self-crosslinkable monomer is glycidyl methacrylate (GMA). The structure of GMA, along with the structures of other suitable (meth)acrylate-based crosslinkable monomers, is shown in FIG. 2(A). The structures of some suitable styrene-based crosslinkable monomers—including a monomer comprising a cycloaliphatic unit based on styrene, are shown in FIG. 2(B). Other crosslinkable epoxy group-containing ethylenically unsaturated monomers can also be used as comonomers in the polymerization, including other aliphatic or bicyclic epoxides. Examples of such epoxy group-containing ethylenically unsaturated monomers can be found in U.S. Pat. No. 7,317,055.

By way of illustration, a random copolymer may be copolymerized from BiBMS as the inimer and GMA as the crosslinkable monomer. The synthesis of such a copolymer is described in detail in the example below and the structure of the resulting copolymer chain is shown in panel (A) of FIG. 3.

Optionally, additional comonomers that are neither inimers nor crosslinkable can be polymerized into the random copolymers in order to alter the properties of the copolymer or to adjust the inimer and/or crosslinker density along the polymer chain. Examples of additional comonomers include (meth)acrylates and vinyl monomers, such as styrenes.

The optimal monomer content of the random copolymers, which can be measured via $^1$H NMR spectroscopy, will depend on the intended final application for the copolymer. For example, if the random copolymers will be used as ATRP initiators for grafting polymer brushes, the inimer content will depend on the desired grafting density. By way of illustration, some embodiments of the random copolymers will have an inimer content in the range from about 10% to about 99%. This includes embodiments in which the inimer content is in the range from about 20% to about 96% and further includes embodiments in which the inimer content is in the range from about 80% to about 98%. In some embodiments, the random copolymer has an inimer content of at least 40%, at least 60%, at least 80% or at least 90%.

The random copolymers desirably include enough of the crosslinkable monomer to provide a stable crosslinked thin film. Typically, this can be accomplished by including about 1% to about 30% (e.g., from about 2% to about 20% or about 4% to about 16%) crosslinkable monomer in the copolymer. However, percentages outside of these ranges can also be used.

The random copolymers can be synthesized using conventional polymerization techniques, including free-radical polymerization or reversible addition fragmentation chain-transfer (RAFT) polymerization techniques.

Once the random copolymers have been formed, they can be crosslinked into polymeric films bearing pendant ATRP initiating groups by the application of heat and/or light. This is illustrated schematically in panel (B) of FIG. 3. By synthesizing the random copolymers before crosslinking them, problems related to blend immiscibility can be avoided, ensuring the fabrication of a highly homogeneous single-component polymer film. Thus, the present methods can be distinguished from methods of making crosslinked polymer films in which a monomer solution is prepared and copolymerization and crosslinking of the monomers occur simultaneously. Because polymer blend immiscibility can be an issue in such methods, the resulting crosslinked films may suffer from inhomogeneity and, therefore, may be multi-component systems.

The crosslinking can be carried out on a substrate surface by spreading the random copolymers on the surface using, for example, spin-coating techniques and then inducing the crosslinking reactions. For example, if the random copolymers comprise thermally crosslinkable pendant groups, crosslinking may be induced by subjecting the copolymers to a thermal anneal. Enough of the copolymer can be deposited onto the substrate surface to achieve a desired thickness for the crosslinked film. The optimal thickness of the film will depend on the desired application of the film. For example, if the crosslinked random copolymer film is to be used as a substrate for pattern transfer in a block copolymer film application, a thinner film may be desirable, such as a film having a thickness in the range from about 2 nm to about 6 nm. However, crosslinked films having thicknesses outside of this range may be fabricated. For example, the films may have a thickness in the range from about 2 to about 100 nm. This includes films having a thickness in the range from about 2 to about 30 nm and further includes films having a thickness in the range from about 10 to about 30 nm. Generally, very thin films (e.g., those having a thickness of about 6 nm or less) will benefit from a higher crosslinking density in order to improve their stability against delamination from the surface of the underlying substrate.

The films can be crosslinked on a variety of substrates and do not need to form covalent bonds with the substrates to achieve stability against delamination. Thus, although covalent bonds may be formed between the random copolymers and the underlying substrate in some instances (as in the case where the substrate comprises an oxide), in some embodiments there is no covalent bonding between the crosslinked films and the underlying substrate. Examples of substrate materials on which the crosslinked films may be formed include silicon, metals (e.g., noble metals, such as gold and platinum), glass, indium-tin-oxide (ITO) coated glass and magnesium oxide. The substrate surfaces upon which the films are formed may be planar or non-planar surfaces.

Although some of the ATRP initiating halogen atoms may be lost during the crosslinking process, crosslinked films made from random copolymers having a high ATRP initiator content will themselves have a high ATRP initiator content. Some embodiments of the crosslinked films have a halogen atom density (e.g., a bromine atom density) of at least 1.5 halogen atoms/nm$^3$. This includes films having a halogen atom density of at least 1.8 halogen atoms/nm$^3$. These ATRP initiator content values refer to values based on the halogen atom density of the film, determined using XPS, as described in the example below.

Once the crosslinked random copolymer films have been prepared, they can be used as grafting substrates for SI-ATRP growth of polymer and copolymer brushes. This process is shown schematically in panel (C) of FIG. 3. During SI-ATRP, the crosslinked copolymer film is exposed to a solution comprising polymerizable monomers and a transition metal complex catalyst under reaction conditions in which the halides of the copolymer film initiate the polymerization of the polymerizable monomers via ATRP. In the initiation step of the ATRP process, the transition metal catalyst abstracts a halogen atom from an alkyl halide functional group on the crosslinked film, creating a radical that is able to add to a polymerizable monomer from the solution. This creates another radical species that is able to propagate the radical polymerization process. The result is a polymer brush comprising an assembly of a polymer chains, each of which is attached at one end to the crosslinked random copolymer film. The polymer chains of the polymer brush are characterized by well-defined molecular weights and low polydispersity indices (e.g., $M_w/M_n \leq 1.5$). The polymer chains of the brush may be linear, branched or hyper-branched.

Monomers that can be polymerized or copolymerized into polymer brushes via SI-ATRP include, vinyl monomer, such as styrenes, acrylates and methacrylates, and combinations thereof. The monomers can be functionalized or unfunctionalized. A description of various monomers that can be polymerized via SI-ATRP can be found in Coessens et al., Functional Polymers by Atom Transfer Radical Polymerization, *Prog. Polym. Sci.* 26 (2001) 337-377.

Because the polymer brushes can be surface grafted from crosslinked films having a high activated halogen atom density, the brushes can themselves have a correspondingly high grafting density. For example, some embodiments of the polymer brushes have a grafting density of at least 0.5 brush polymer chains per nm². This includes embodiments of the polymer brushes having a grafting density of at least 0.8 brush polymer chains per nm². These grafting densities refer to densities calculated from the dry brush thickness and the number average molecular weight ($M_n$) of the polymers, as described in the example below.

Figure 4:
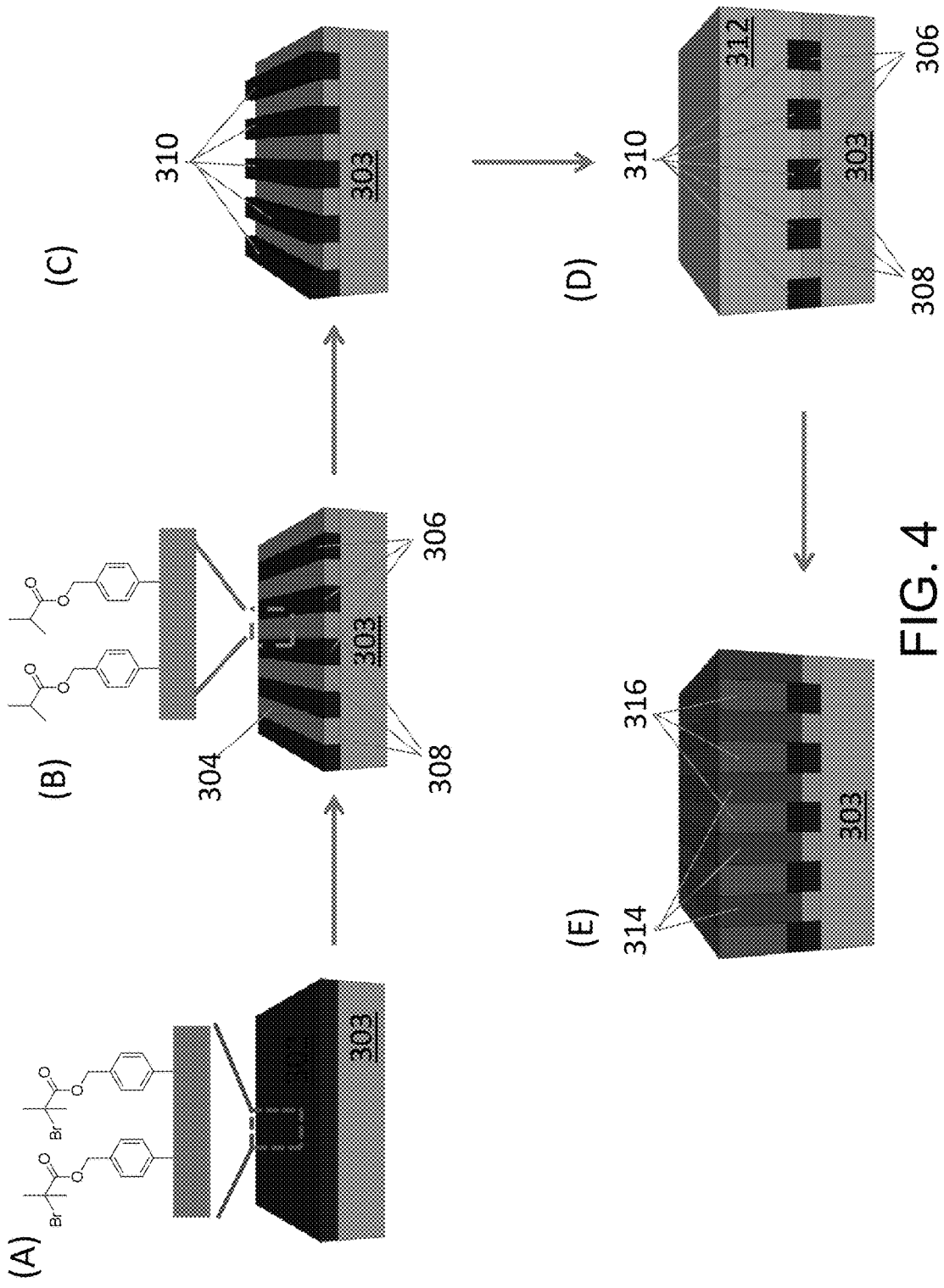
FIG. 4 is a schematic illustration of the process for the formation of a self-assembled block copolymer film.

For certain applications, it may be useful to pattern the crosslinked random copolymer films prior to polymer brush growth by removing one of more portions of the film. For example, patterned crosslinked films are useful substrates for the formation of patterned, self-assembled block copolymer (BCP) films. FIG. 4 is a schematic diagram illustrating the use of a patterned crosslinked random copolymer film in the fabrication of a patterned polymer brush layer and the subsequent fabrication of a self-assembled BCP layer. As shown in panels (A) and (B) of FIG. 4, the first step of the process is the formation of a patterned in the crosslinked random copolymer film 302. As shown here, a pattern can be formed by the selective removal of the ATRP initiating halides from selected regions 304 of the film. Such selective removal can be accomplished using a photomask and UV irradiation. Alternatively, patterning can be accomplished by the removal of portions of the film from the substrate 303. Optionally, a different material can then be grown on substrate 303 over the areas where the crosslinked film has been removed. The patterning can be carried out using standard lithographic techniques, such as x-ray lithography, extreme ultraviolet lithography and/or electron beam lithography. The result is a layer comprising a plurality of regions 306 of ATRP-initiating, crosslinked random copolymer film interspersed with a plurality of regions 308 of a material 304 that is not an ATRP initiator. As shown in panel (B), the pattern can be a regular repeating pattern, such as a series of alternating stripes aligned along their longitudinal axes. However, other patterns, including random patterns, can also be used. If the patterned film is to be used in the fabrication of a self-assembled BCP layer, material 304 should be selected such that it is preferentially wet by one of the polymer blocks in the BCP.

As illustrated in panel (C) of FIG. 4, a polymer brush 310 can be selectively grafted from surface regions 306, which comprise the ATRP initiating crosslinked polymer film, to provide a patterned polymer brush layer. A layer of a BCP 312 is then deposited over the patterned polymer brush layer (panel (D)), which self-assembles (typically upon the application of a thermal anneal) into a plurality of domains 314, 316 (panel (E)). Although not shown here, the process can also include the subsequent steps of selectively removing one of the polymer domains from BCP layer 312 to form a mask and transferring the mask pattern into the underlying substrate.

The block copolymer film, which typically comprises a diblock copolymer, defines a pattern, which is produced by the self-assembly of the block copolymer induced by the underlying crosslinked copolymer film. The characteristics of the pattern may vary. In some embodiments, the pattern comprises domains oriented perpendicular with respect to the surface of the underlying substrate. In other embodiments, the pattern comprises domains oriented parallel with respect to the surface of the underlying substrate. The domains themselves may comprise a variety of molecular structures. In some embodiments, the domains comprise cylinders. In other embodiments, the domains comprise lamellae. Finally, by "perpendicular" it is meant that the molecular structures within the domains form an approximate, but not necessarily exact, right angle with the surface of the substrate. Similarly, the term "parallel" is meant to encompass molecular structures which are oriented approximately parallel to the surface of the substrate.

The block copolymer may be formed from a variety of copolymers. In some embodiments, the block copolymer comprises a diblock copolymer of a polystyrene (PS) and polymethyl methacrylate (PMMA).

EXAMPLE

Experimental Section

Materials.

All chemicals were purchased from Sigma-Aldrich and used without further purification unless otherwise noted. 4-vinylbenzyl alcohol was synthesized according to a literature procedure. (See, Zhao, L. J.; Kwong, C. K. W.; Shi, M.; Toy, P. H., Optimization of Polystyrene-Supported Triphenylphosphine Catalysts for aza-Morita-Baylis-Hillman Reactions. *Tetrahedron* 2005, 61 (51), 12026-12032.) Copper(I) bromide (99.999%) was stirred in acetic acid overnight, suction-filtered, washed with ethanol and then dried under vacuum. Styrene, glycidyl methacrylate and methyl methacrylate (MMA) were stirred over calcium hydride and then distilled under vacuum. 4-cyano-4-[(dodecylsulfanylthiocarbonyl)sulfanyl]pentanoic acid was synthesized according to a literature procedure. (See, Moad, G.; Chong, Y. K.; Postma, A.; Rizzardo, E.; Thang, S. H., Advances in RAFT Polymerization: the Synthesis of Polymers with Defined End-Groups. *Polymer* 2005, 46, 8458-8468) 2,2'-azobis(2-methylpropionitrile) (AIBN) was recrystallized from acetone and dried under vacuum.

Synthesis of p-(2-bromoisobutyloylmethyl)styrene (BiBMS)

4-vinylbenzyl alcohol (28.18 g, 210 mmol) was dissolved in 750 mL of dichloromethane and chilled via an external ice bath under a nitrogen atmosphere. 4-(dimethylamino)pyridine (1.28 g, 10.5 mmol) and triethylamine (38.47 g, 380 mmol) were added to the solution and stirred until dissolved. 2-bromoisobutyryl bromide (59.5 g, 259 mmol) was added slowly by syringe and the reaction stirred at 0° C. until thin-layer chromatography (TLC) showed complete conversion. The reaction was quenched via the addition of water and the layers separated using a separatory funnel. The organic layer was washed twice with water, 1 M HCl and 1 M NaOH, then dried over sodium sulfate and the solvent was removed by rotary evaporation. The resulting oil was distilled under reduced pressure (approx. 1 torr) at 130° C. to give a near colorless oil with a yield of 50 g (84% of theoretical yield). ¹H NMR (400 MHz, CDCl₃) δ 7.41 (d, J=8.3 Hz, 2H), 7.33 (d, J=8.3 Hz, 2H), 6.71 (dd, J=17.6, 10.9 Hz, 1H), 5.76 (dd, J=17.6, 0.9 Hz, 1H), 5.27 (dd, J=17.6, 0.9 Hz, 1H), 5.19 (s, 2H), 1.94 (s, 6H). ¹³C NMR (101 MHz, CDCl₃) δ 171.49, 137.71, 136.33, 134.89, 128.24, 126.43, 114.44, 67.38, 55.72, 30.81.

Synthesis of p-(2-bromoisobutyloylmethyl)ethylbenzene 4-ethylbenzyl alcohol (5.0 g, 36.7 mmol) was dissolved in 100 mL dichloromethane with 4-(dimethylamino)pyridine (22.4 mg, 0.18 mmol) and triethylamine (6.72 g, 66 mmol) under nitrogen and chilled to 0° C. 2-bromoisobutyryl bromide (10.4 g, 45.2 mmol) was added slowly by syringe and the reaction stirred at 0° C. until TLC showed complete conversion. The reaction was quenched via the addition of water and the layers separated using a separation funnel. The organic layer was washed twice with water, 1 M HCl and 1 M NaOH, then dried over sodium sulfate and the solvent was removed by rotary evaporation. The resulting oil was then passed through a column of basic alumina to yield 9 g (86% yield). $^1$H NMR (400 MHz, CDCl$_3$) δ 7.30 (d, J=8.3 Hz, 2H), 7.20 (d, J=8.3 Hz, 2H), 5.17 (s, 2H), 2.65 (q, J=7.6 Hz, 2H), 1.94 (s, 6H), 1.24 (t, J=7.6 Hz, 3H).

Synthesis of P(BiBMS-r-GMA).

BiBMS (2.55 g, 9 mmol), GMA (0.14 g, 1 mmol), 4-cyano-4-[(dodecylsulfanylthiocarbonyl)sulfanyl]pentanoic acid (40.3 mg, 0.1 mmol), and AIBN (4.1 mg, 0.025 mmol) were added to 1 gram anisole in a 10 mL Schlenk flask equipped with a magnetic stir bar. The mixture was degassed via three freeze-pump-thaw cycles and placed in an oil bath at 85° C. for 16 hours. The polymerization was quenched by cooling the flask with cold water and exposure to air. The resulting viscous oil was then diluted with THF and precipitated into hexanes. The polymer was collected as a yellow powder and dried under vacuum. The relative composition of the two monomers was determined by $^1$H NMR spectroscopy.

Synthesis of P(S-r-BiBMS-r-GMA).

BiBMS (0.849 g, 3 mmol), GMA (0.071 g, 0.5 mmol), styrene (0.68 g, 6.5 mmol), 4-cyano-4-[(dodecylsulfanylthiocarbonyl)sulfanyl]pentanoic acid (40.3 mg, 0.1 mmol), and AIBN (4.1 mg, 0.025 mmol) were added to 1 gram anisole in a 10 mL Schlenk flask equipped with a magnetic stir bar. The mixture was degassed via three freeze-pump-thaw cycles and placed in an oil bath at 75° C. for 16 hours. The polymerization was quenched by cooling the flask with cold water and exposure to air. The resulting viscous oil was then diluted with THF and precipitated into hexanes. The polymer was collected as a yellow powder and dried under vacuum. The relative composition of the three monomers was determined by $^1$H NMR spectroscopy.

Substrate Preparation and Thin Film Formation.

A solution of P(BiBMS-r-GMA) or P(S-r-BiBMS-r-GMA) (0.3% w/w) in toluene was spin-coated onto silicon wafers that had been cleaned using piranha acid (7:3 H$_2$SO$_4$: H$_2$O$_2$, caution: reacts violently with organic compounds). The substrate was then annealed under vacuum at 200° C. for various times to produce a cross-linked thin film. After annealing, the substrate was soaked in toluene and rinsed copiously with fresh toluene to remove uncross-linked polymer.

Surface-Initiated Atom Transfer Radical Polymerization (SI-ATRP).

MMA (4 grams, 40 mmol), tris-(2-pyridylmethyl)amine (60 mg, 0.21 mmol), CuBr (4.0 mg, 0.028 mmol), CuBr$_2$ (6.4 mg, 0.028 mmol), p-(2-bromoisobutyloylmethyl)ethylbenzene (7.6 mg, 0.027 mmol) and anisole (40 g) were mixed and sonicated until the copper completely dissolved into the brown solution. Equal amounts of the polymerization mixture were then added to four different flasks containing substrates covered with the cross-linked inimer mat and magnetic stir bars. The flasks were then degassed via three freeze-pump-thaw cycles. After warming to room temperature using a water bath, the flasks were immersed in a 60° C. oil bath for the requisite amount of time. After the requisite amount of time elapsed, the flasks were cooled to room temperature using running water and the flask opened to atmosphere. The substrate was then removed from the flask and washed copiously with THF and water. After washing, the substrate was further soaked in THF for 2 hours, then sonicated in THF for 10 minutes, followed by rinsing with THF to remove any ungrafted polymer chains and dried using a stream of nitrogen. Some samples were further subjected to Soxhlet extraction using acetone for 18 hours to ensure that the THF treatment removed any ungrafted polymer.

Characterization.

$^1$H NMR and $^{13}$C NMR spectra were recorded in CDCl$_3$ using a Bruker Avance-400 spectrometer with TMS as internal standard. Gel-permeation chromatography (GPC) was performed using a Viscotek 2210 system equipped with three Waters columns (HR 4, HR 4E, HR 3) and a 1 mL/min flow rate of THF as eluent at 30° C. Monodisperse PS standards were used for calibration. The film thickness of the samples was measured by ellipsometry (Rudolph Research Auto EL). The surface topography of the cross-linked mat and brush layer was examined using a Nanoscope III Multimode atomic force microscope (Digital Instruments) in tapping mode. Thermal gravimetric analysis was performed on a TA Instruments Q500 using a heating rate of 10° C. per minute under a nitrogen atmosphere. X-ray photoelectron spectroscopy (XPS) was done on a PerkinElmer 5400 ESCA spectrometer Phi model using a Mg X-ray source (300 W, 15 kV) at a takeoff angle of 45° from the substrate normal. The hemispherical energy analyzer was used in hybrid mode with a 1 mm×3.5 mm area aperture. Survey spectra were collected at pass energy of 89.45 eV with a scan step size of 1.0 eV. High-resolution multiplex spectra were collected with pass energy of 35.75 eV and a step size of 0.05 eV. Water contact angle was measured with a Dataphysics OCA 15 Plus.

Results and Discussion

Synthesis of Random Copolymer.

Figure 3:
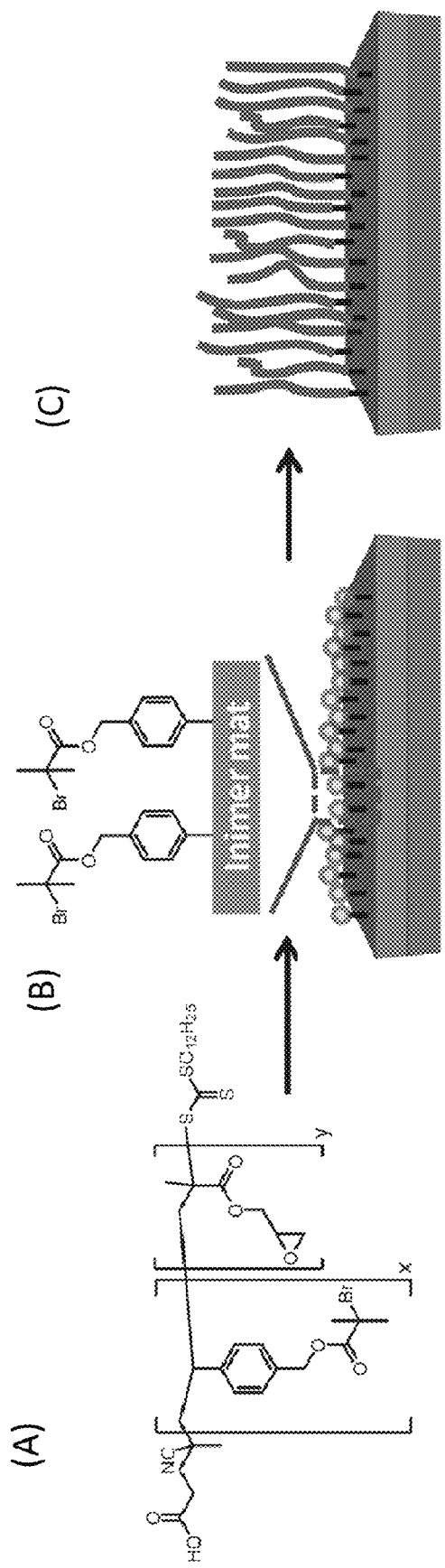
FIG. 3 is a schematic illustration of the process for the formation of a brush polymer using a crosslinked ATRP initiating polymer film.

The synthesis of the random copolymer from BiBMS and GMA by RAFT polymerization, where the inimer is the majority component of the copolymer and GMA allows for the formation of a cross-linked mat, is shown in Scheme 1 of FIG. 3. The composition of the copolymer was determined to be 84% BiBMS and 16% GMA by $^1$H NMR spectroscopy.

Formation of Cross-Linked Mat and XPS Quantification.

TGA shows an initial decomposition step at 230° C., likely due to decarboxylation and subsequent loss of propylene through bromide elimination. Therefore, a cross-linking temperature of 200° C. was chosen to avoid unintentional degradation of the polymer during cross-linking while maintaining a rapid cross-linking rate. A 0.3% w/w solution in toluene of random copolymer was spin-coated onto silicon wafers to yield ~9 nm thick films. The substrates were then heated under vacuum at 200° C. for predetermined times and quenched to room temperature. After repeated washing in toluene, the samples were dried under nitrogen and the remaining thickness measured by ellipsometry. The film thickness after cross-linking but prior to washing was used as the initial thickness for determining cross-linking efficiency.

After 10 minutes, the normalized thickness started to plateau at approximately 90% of the original value. Despite the relatively low molecular weight (11.8 kDa), extensive cross-linking was achieved through a comparatively large amount of GMA. To determine the effect of this processing on the initiating units, the amount of bromine in the mat was quantified by XPS. XPS survey spectra showed the presence of bromine. The film thickness was controlled to be less than the typical XPS sampling depth (~10 nm) so that Si peaks from the substrate were also visible.

The absolute elemental concentration can be determined from the intensity ratio of the element in the organic thin film to an element in the underlying substrate whose atomic density is known. (See, Paoprasert, P.; Spalenka, J. W.; Peterson, D. L.; Ruther, R. E.; Hamers, R. J.; Evans, P. G.; Gopalan, P., Grafting of Poly(3-hexylthiophene) Brushes on Oxides Using Click Chemistry. *J. Mat. Chem.* 2010, 20, 2651-2658, Franking, R. A.; Landis, E. C.; Hamers, R. J., Highly Stable Molecular Layers on Nanocrystalline Anatase $TiO_2$ through Photochemical Grafting. *Langmuir* 2009, 25, 10676-10684.) The native oxide layer was employed as a reference, as the density of silicon in the oxide is well known and the oxide thickness can be determined experimentally.

In general, the intensity of the XPS signal is given by the equation $$I_s = I_0 \cdot e^{-\frac{d}{\lambda \cos\theta}} \quad (1)$$

where $I_S$ is the detected intensity, $I_0$ is the incident electron intensity, d is the depth of the electrons emitted in the material, $\lambda$ is the inelastic mean free path (IMFP) of electrons in the material and $\theta$ is the take-off angle. In the sample, signal from emitted electrons in three different layers contribute to the XPS spectrum: emitted electrons from silicon atoms in the silicon substrate, from silicon atoms in the native oxide and from various elements (C, O and Br) in the cross-linked mat. The intensity of emitted electrons from silicon atoms in the native oxide, $I_{Si,SiO_2}$ can be calculated by integrating the exponential equation $$I_{Si,SiO_2} = N_{Si,SiO_2} \cdot \int_0^{T_{ox}} e^{-\frac{z}{\lambda_{Si,SiO_2} \cdot \cos\theta}} dz \quad (2)$$

through the native oxide layer, typically 1.1 nm in the experiments, where $N_{Si,SiO_2}$ is the number density of silicon atoms in native oxide layer (22.06 atoms/nm³), $T_{ox}$ is the thickness of the native oxide, and $\lambda_{Si,SiO_2}$ is the IMFP of the electrons from silicon in the native oxide layer. The emitted electrons further travel through the organic thin film layer, and then escape from the material and reach the detector, resulting in the Si(2p) peak at 101.5~104.5 eV. Therefore, the intensity of the peak is:

$$\frac{A_{Si}}{S_{Si}} = N_{Si,SiO_2} \cdot e^{-\frac{L}{\lambda_{Si,organic} \cdot \cos\theta}} \cdot \int_0^{T_{ox}} e^{-\frac{z}{\lambda_{Si,SiO_2} \cdot \cos\theta}} dz \quad (3)$$

where $A_{Si}$ is the integrated intensity of the Si(2p) peak of $SiO_2$, $S_{Si}$ is the relative sensitivity factor of Si(2p), L is the thickness of the organic thin film and $\lambda_{Si,organic}$ is the IMFP of the electrons emitted from silicon traversing the organic thin film layer.

The electrons emitted from the organic layer, specifically from the bromine atoms in the cross-linked mat, travel through the organic layer and reach the detector, resulting in a Br(3d) peak at 69.0~72.5 eV. Thus, the intensity of the Br(3d) peak can be formulated by the equation of $$\frac{A_{Br}}{S_{Br}} = N_{Br,organic} \cdot \int_0^{L} e^{-\frac{z}{\lambda_{Br,organic} \cdot \cos\theta}} dz \quad (4)$$

where $A_{Br}$ is the integrated intensity of Br(3d) peak, $S_{Br}$ is the relative sensitivity factor of Br(3d) and $\lambda_{Br,organic}$ is the IMFP of the electrons from bromine in the organic thin film layer. The intensity ratio of Si(2p) to Br(3d) is given by $$\frac{\frac{A_{Si}}{S_{Si}}}{\frac{A_{Br}}{S_{Br}}} = \frac{N_{Si,SiO_2} \cdot e^{-\frac{L}{\lambda_{Si,organic} \cdot \cos\theta}} \cdot \int_0^{T_{ox}} e^{-\frac{z}{\lambda_{Si,SiO_2} \cdot \cos\theta}} dz}{N_{Br,organic} \cdot \int_0^{L} e^{-\frac{z}{\lambda_{Br,organic} \cdot \cos\theta}} dz} \quad (5)$$

from equation (3) and (4). Equation (5) can be rewritten as $$N_{Br,organic} = \frac{\frac{A_{Br}}{S_{Br}}}{\frac{A_{Si}}{S_{Si}}} \cdot \frac{N_{Si,SiO_2} \cdot e^{-\frac{L}{\lambda_{Si,organic} \cdot \cos\theta}} \cdot \int_0^{T_{ox}} e^{-\frac{z}{\lambda_{Si,SiO_2} \cdot \cos\theta}} dz}{\int_0^{L} e^{-\frac{z}{\lambda_{Br,organic} \cdot \cos\theta}} dz} \quad (6)$$

where, $N_{Br,organic}$ is the number density of bromine in the cross-linked mat.

The thickness of the cross-linked mat was 5.8±0.4 nm, and $\lambda_{Si,SiO_2}$, $\lambda_{Si,organic}$ and $\lambda_{Br,organic}$ values were obtained from the literature. (See, Powell, C. J.; Jablonski, A., Evaluation of Electron Inelastic Mean Free Paths for Selected Elements and Compounds. *Surf Interface Anal.* 2000, 29, 108-114, Laibinis, P. E.; Bain, C. D.; Whitesides, G. M., Attenuation of Photoelectrons in Monolayers of Normal-Alkanethiols Adsorbed on Copper, Silver, and Gold. *J. Phys. Chem.* 1991, 95, 7017-7021.) From the high resolution XPS spectra of Br(3d) and Si(2p), the integrated intensity ratio, corrected for the relative sensitivity factors of Br(3d) and Si(2p) ($S_{Br}$=1.053 and $S_{Si}$=0.339), was found to be 2.23±0.26 [($A_{Br}/S_{Br}$)/($A_{Si}/S_{Si}$) in equation (6)]. From this result, the calculated density of bromine in the cross-linked $N_{Br,organic}$, was 1.86±0.12 Br atoms/nm³. For comparison, the theoretical amount of initiator per unit volume ($\pi_{ini}$) calculated using the number average molecular weight ($M_n$) and the number of inimer units per chain (the same as $N_{Br}$), as determined from GPC and ¹H NMR, respectively can be calculated from the equation $$\rho_{ini} = \rho_p \cdot N_{av} \cdot N_{Br}/M_n \quad (7)$$

where, $N_{av}$ is Avogadro's number and $\rho_p$ is the density of copolymer which is 1.30 g/cm³ (assuming the density of copolymer is similar to the weighted average density of the two monomers). Calculated $\rho_{ini}$ is 2.53 initiators/nm³, which is slightly higher than the experimentally determined value. The ratio of experimental density to calculated absolute initiator density is 0.735, suggesting that approximately 25% of the bromine is lost during processing.

Next the calculated results were compared with the relative initiator concentration by looking at the ratio of bromine to carbon. To do so, an examination was made of the calculated intensity ratio of Br(3d) to C(1s) peaks from high resolution XPS spectra (N(Br)/N(C)) and the theoretically estimated value from the compositional information obtained from ¹H NMR. The experimental data gave a N(Br)/N(C) of 0.0523±0.001, while the theoretical value was 0.0700, resulting in the ratio of experimental value to theoretical value of 0.747. This value obtained from the relative intensity ratio is in excellent agreement with the values of $N_{Br}/\rho_{ini}$ of 0.735 obtained from the quantitative comparison with the Si(2p) peak above.

In order to further verify the quantitative XPS analysis model, a different copolymer, which reduced the amount of inimer by incorporating an additional monomer that does not have bromine e.g. styrene was synthesized. This copolymer consisted of styrene, BiBMS and GMA ($M_n$=11.7 kDa, PDI=1.61, $F_{st}$=0.62, $F_{BiBMS}$=0.29, $F_{GMA}$=0.09, determined by GPC and $^1$H NMR). The cross-linked mat (5.0±0.2 nm) was formed in the same manner as before on native oxide/Si substrate, followed by XPS characterization. Using equation (6) and (7), the experimental ($N_{Br}$) and the theoretical ($\rho_{ini}$) number density of initiator were 0.90±0.18 Br atoms/nm$^3$ and 1.15 initiators/nm$^3$, respectively. This, again confirmed the experimental value to be lower than the theoretical estimate (ratio of experimental to theoretical values was 0.78, comparable to the 0.735 from the previous calculation). Furthermore, it shows that the amount of initiator on the surface can be easily tuned by introducing a comonomer and thereby changing the molar ratio of inimer in the copolymer.

Surface Initiated ATRP of PMMA.

Following the quantitative analysis of inimer in the cross-linked film, the growth of polymer brushes from the mat was examined Specifically, of interest was the resulting chain density of grown polymer brushes considering the sheer density of initiating groups available for polymerization (1.86 Br/nm$^3$). Therefore, a qualitative determination of the chain density on the surface was made by correlating the molecular weight of sacrificial polymer grown in solution to the resulting brush layer thickness of the substrate using a well-known monomer, MMA.

In the first experiments, standard ATRP conditions were used for the solution growth of PMMA (ethyl-2-bromoisobutyrate, CuBr and PMDETA) and the sacrificial polymer grown in solution (PDI<1.2) was successfully controlled. However, under these conditions, the solution molecular weight did not reasonably correlate to the measured brush thickness. The polymer brush height implied a length longer than the fully-extended contour length of a polymer with the solution molecular weight that was measured. Therefore, several parameters were optimized.

Figure 5:
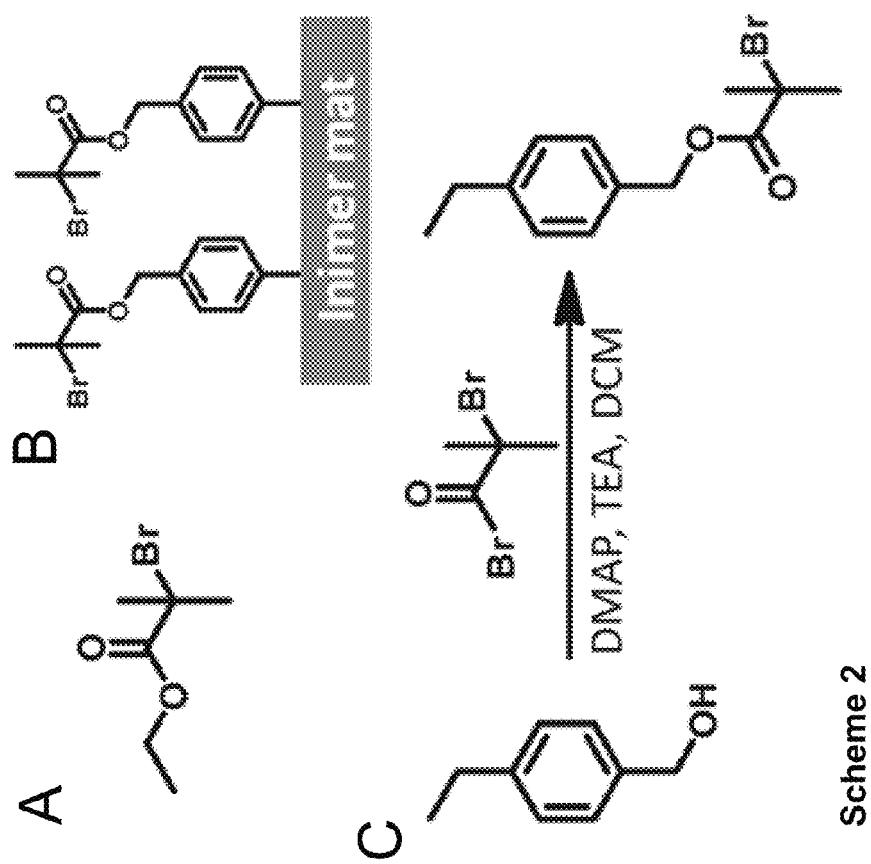
FIG. 5. Structure of (A) ATRP initiator ethyl 2-bromoisobutyrate, (B) initiating sites on the surface, and (C) the synthetic scheme for the initiator p-(2-bromoisobutyloylmethyl)ethylbenzene.

First, it needed to be ensured that the initiating species had as similar a reactivity between solution and substrate as possible. Even though ethyl 2-bromoisobutyrate (Scheme 2a, FIG. 5(A)) has the same α-haloester type ATRP initiating moiety as BiBMS (Scheme 2b, FIG. 5(B)), Matyjaszewski et al. have shown that going from methyl 2-bromoisobutyrate to ethyl 2-bromoisobutyrate almost halves the ATRP equilibrium constant keeping everything else constant. (See, Tang, W.; Matyjaszewski, K., Effects of Initiator Structure on Activation Rate Constants in ATRP. *Macromolecules* 2007, 40, 1858-1863, Tang, W.; Kwak, Y.; Braunecker, W.; Tsarevsky Nicolay, V.; Coote Michelle, L.; Matyjaszewski, K., Understanding Atom Transfer Radical Polymerization: Effect of Ligand and Initiator Structures on the Equilibrium Constants. *J. Am. Chem. Soc.* 2008, 130, 10702-10713.) Therefore, it was important to account for this possible reactivity difference. A new ATRP initiator p-(2-bromoisobutyloylmethyl)ethylbenzene (Scheme 2c, FIG. 5(C)) was thus synthesized to mimic the propagating reactive sites on the surface by having the same molecular structure with an ethyl moiety instead of vinyl. Secondly, as the monomer is depleted in solution, it is likely that any discrepancy in molecular weight between the surface and the substrate will be magnified due to viscosity and other kinetics issues. A very small amount of initiator (target 1500 DP) was used to initiate the sacrificial polymer in solution which allowed the monomer concentration to stay as constant as possible. A magnetic stir bar was used to promote a homogeneous solution, maintaining consistent concentrations without gradients. Also, copper (II) bromide was found to be the most effective parameter for controlling the brush growth rate. However, by including CuBr$_2$, this slowed the solution growth of the PMMA to an unreasonable extent, hence a stronger ligand (tris-(2-pyridylmethyl)amine, TPMA) was used to counteract this effect. The combination of strong ligand and stoichiometrically large amount of CuBr$_2$ allowed for the solution grown PMMA to have a PDI of less than 1.10.

Figure 6:
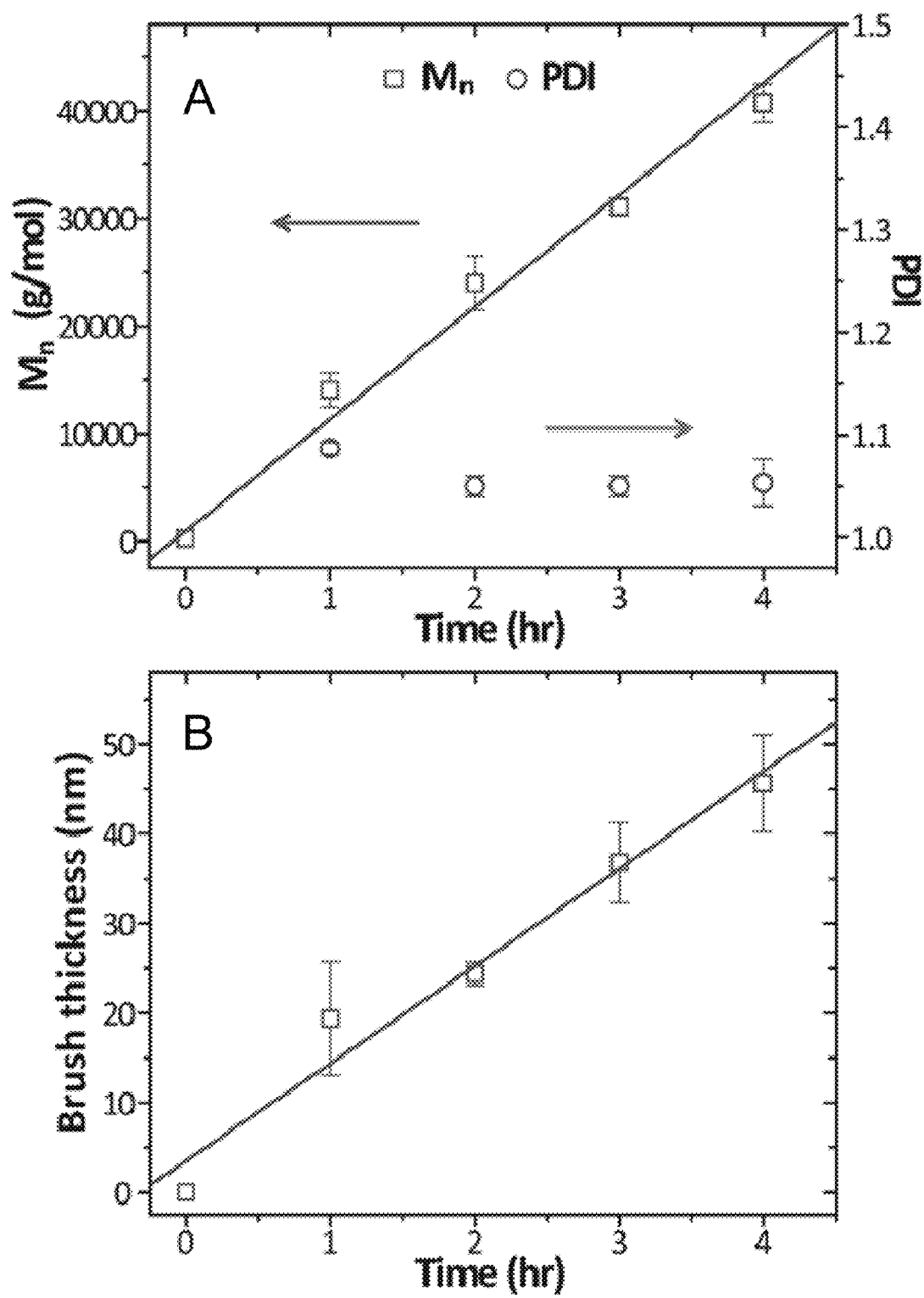
FIG. 6. Plots showing (A) $M_n$ and PDI of the PMMA grown in solution as a function of polymerization time during SI-ATRP of MMA, and (B) the linear increase in brush thickness as a function of time.

With the conditions for SI-ATRP thus optimized, kinetic studies were done to examine the brush growth over time and its correlation to solution molecular weight. First, the PMMA polymerized in solution exhibits excellent control and linear kinetics as evidenced by the linear increase in $M_n$ with time (due to the low overall conversion of monomer) and the narrow PDI (FIG. 6). The brush thickness also exhibited a linear relationship with polymerization time, showing a well-controlled polymerization on the surface as well. Ungrafted polymer was removed by soaking the substrates in THF for two hours and followed by sonication for 10 minutes. To ensure this THF treatment was efficient at removing ungrafted polymer, substrates were subjected to Soxhlet extraction with acetone for 18 hours. After extraction, the thickness was identical to the previous results from sonicating in THF, confirming the successful removal of ungrafted polymer, as well as the stability of the mat.

Figure 7:
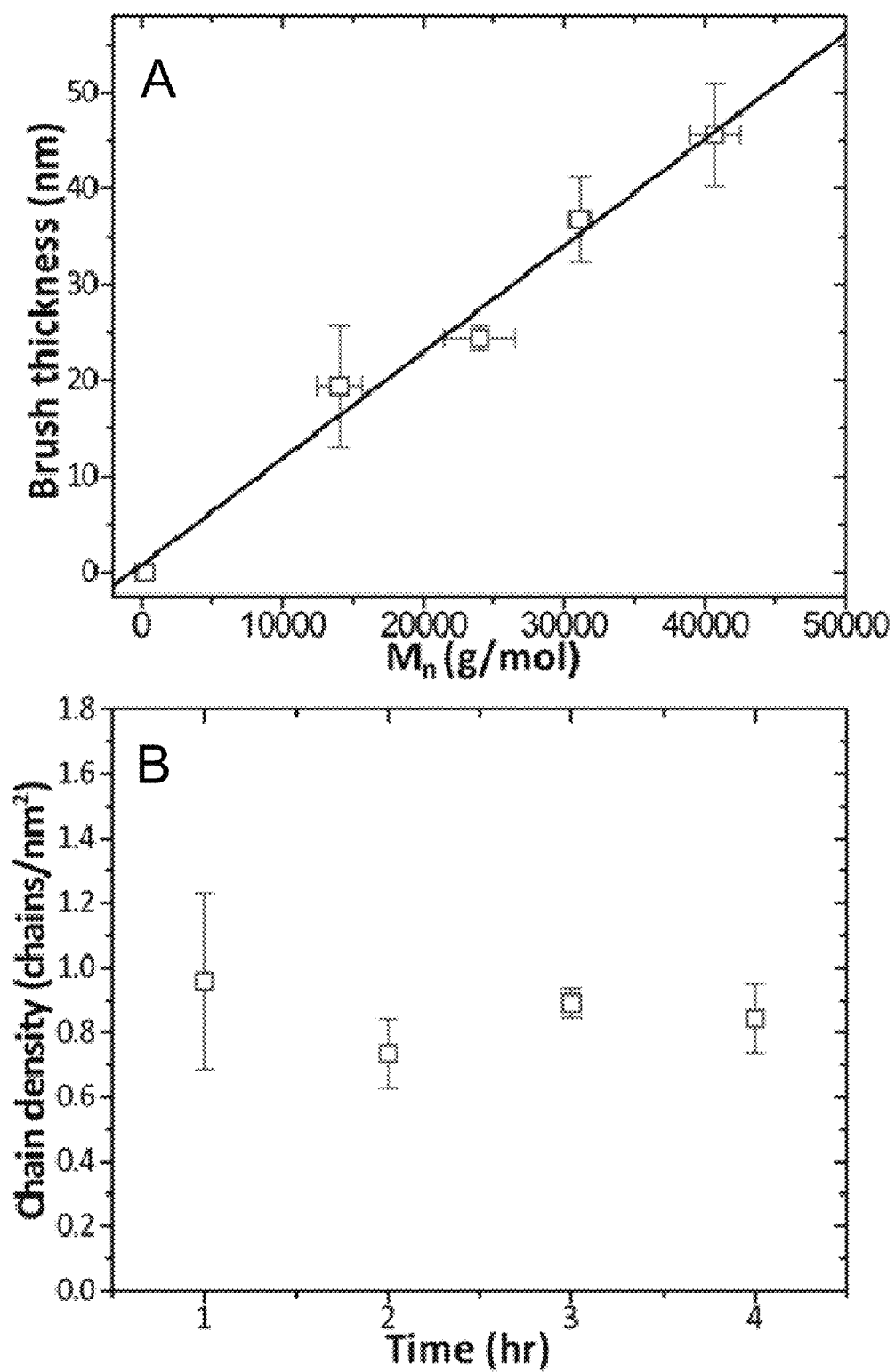
FIG. 7. Kinetics data from SI-ATRP of MMA showing (A) a linear correlation between the brush thickness and the $M_n$ of the PMMA grown in solution, and (B) the uniform average chain density at various polymerization times.

By correlating the dry brush thickness (h) with the $M_n$ of PMMA grown in solution, the chain density (ρ) can be calculated using a standard equation (8), $$\rho = h \cdot N_{av} \cdot \rho / M_n \qquad (8)$$

where ρ=1.19 g/cm$^3$ (bulk density of PMMA). As ρ and $N_{av}$ are constant, the relationship between brush thickness and molecular weight is linear, with the chain density as the slope of the line (equal to σ/($N_{av} \cdot \rho$)). In FIG. 7(A), the graph showing brush thickness as a function of molecular weight exhibits a clear linear trend over the experimental time examined Using equation (8), the chain density was calculated to be 0.80±0.06 chains/nm$^2$. The chain density can also be calculated for each polymerization time by directly applying equation (8) and the resulting data is also plotted in FIG. 7(B), demonstrating a high chain density that was constant for the entire polymerization time.

Atomic force microscopy (AFM) was used to examine the surface morphology of both the inimer mat and grown polymer brush films. The AFM height data for the inimer mat and after 3 hours of SI-ATRP showed that inimer mat exhibited extremely low roughness with an average height variation of less than 0.4 nm over a 5×5 μm$^2$ area. All polymer brush films examined showed similar AFM micrographs with a roughness of 1.82 nm, 3.73 nm and 3.56 nm for 1 hour, 2 hours and 3 hours of polymerization, respectively. Typically, there were large flat areas with occasional divots which traversed the full brush thickness down to the inimer mat. A slower polymerization rate could allow for an even more uniform film.

Figure 8:
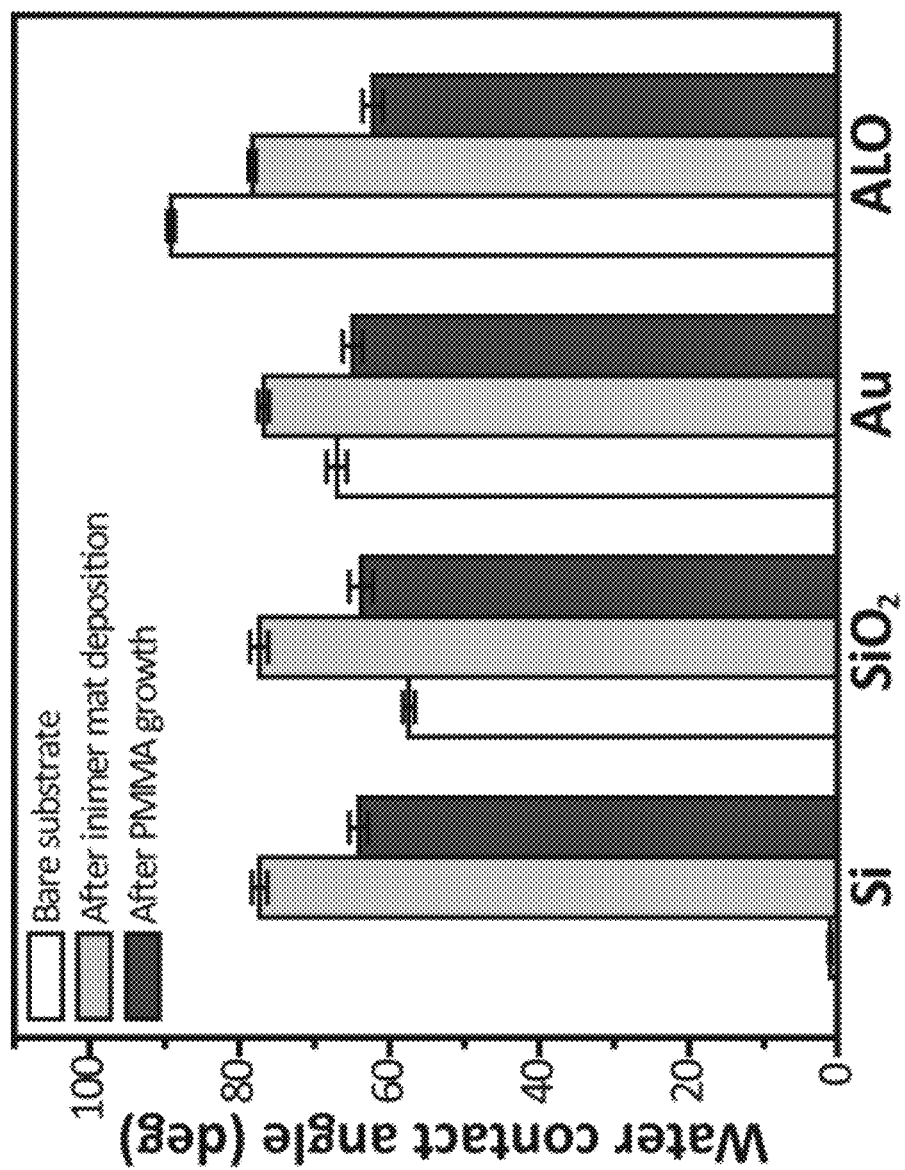
FIG. 8. Static water contact angles for various substrates before inimer mat formation, after cross-linking and after growth of PMMA brushes.

The effect of different substrates on the polymer brush growth was also examined. In addition to the piranha treated bare Si discussed extensively, inimer mats were prepared on SiO$_2$/Si, Au/Si and aluminum oxide/Si substrates. SiO$_2$, Au and aluminum oxide substrates were prepared by evaporation of source materials using e-beam dielectric or metal evaporators onto Si wafers. While the bare silicon was cleaned with piranha acid, the other substrates were not chemically cleaned to preserve their inherent properties. The inimer mat was formed in the same manner as before, through spin-coating and thermal cross-linking. The mats were then subjected to two hours of PMMA polymerization under the optimized conditions discussed earlier. Static water contact angle measurements of the bare substrate, the inimer mat and the brush layer were taken to judge the efficacy of the film at growing brushes on various substrates (FIG. 8). All of the bare substrates showed the expected contact angles while post-deposition of the mat and growth of PMMA brushes, the contact angles for the various substrates became equivalent.

To further confirm the growth of PMMA on the surface, XPS was used to characterize the brush films. The intensity ratio of deconvoluted C—C or C—H, C—O and O═C—O peaks showed good agreement with the theoretical ratios for PMMA, providing additional evidence for polymer brush growth.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a self-assembled block copolymer film using a crosslinked copolymer film on a substrate surface, the crosslinked copolymer film comprising crosslinked random copolymer chains, wherein the random copolymer is a copolymer of a first monomer comprising an alkyl halide functional group that is capable of acting as an ATRP initiator, and a second monomer, and further wherein the alkyl halide functional groups are pendant groups on the backbone of the random copolymer chains and the crosslinks between the random copolymer chains are formed between crosslinkable functional groups on the second monomers, the method comprising:

patterning the crosslinked copolymer film to provide a plurality of regions comprising the alkyl halide functional groups that are capable of acting as ATRP initiators and a plurality of regions that do not have ATRP initiating functional groups;

exposing the crosslinked copolymer film to a solution comprising polymerizable monomers and a transition metal complex under reaction conditions in which the alkyl halide functional groups initiate the polymerization of the polymerizable monomers into a polymer brush via atom transfer radical polymerization to provide a patterned polymer brush layer; and depositing a block copolymer film over the patterned polymer brush layer, wherein the patterned polymer brush layer induces the block copolymer to self-assemble into patterned domains;

wherein the first monomer is selected from acrylate monomers having an alkyl halide functional group, methacrylate monomers having an alkyl halide functional group, styrene monomers having an alkyl halide functional group, or combinations thereof, and wherein the crosslinked copolymer film has a halogen atom density of at least 1.5 atoms/nm3.

2. The method of claim 1, wherein the crosslinkable functional groups comprise thermally self-crosslinking functional groups.

3. The method of claim 1, wherein the crosslinkable functional groups comprise thermally crosslinkable epoxy groups.

4. The method of claim 1, wherein the crosslinkable functional groups comprise thermally crosslinkable epoxy groups.

5. The method of claim 1, wherein the polymer brushes have a grafting density of at least 0.5 brush polymer chains per nm$^2$.

6. The method of claim 1, wherein the crosslinked copolymer film is not covalently bonded to the substrate surface.

7. The method of claim 1 further comprising selectively removing one of the patterned domains from the self-assembled block copolymer to form a mask having a pattern over the substrate surface and transferring the pattern of the mask into the substrate surface.

8. The method of claim 7, wherein the first monomer is p-(2-bromoisobutyloylmethyl)styrene, the second monomer is glycidyl methacrylate, the polymer brush is a polymethyl methacrylate polymer brush, and the block copolymer is a polystyrene-block-polymethyl methacrylate block copolymer.

9. The method of claim 1, wherein the first monomer is p-(2-bromoisobutyloylmethyl)styrene and the second monomer is glycidyl methacrylate.

\* \* \* \* \*

UNITED STATES PATENT AND TRADEMARK OFFICE
CERTIFICATE OF CORRECTION

PATENT NO. : 10,106,699 B2
APPLICATION NO. : 14/168383
DATED : October 23, 2018
INVENTOR(S) : Padma Gopalan et at.

It is certified that error appears in the above-identified patent and that said Letters Patent is hereby corrected as shown below:

In the Specification

Column 12, Line 42:
Delete the phrase "$(\pi_{ini})$" and replace with --$(\rho_{ini})$--.

Column 14, Line 35:
Delete the phrase "$\rho = h \cdot N_{av} \cdot \rho / M_n$" and replace with --$\sigma = h \cdot N_{av} \cdot \rho / M_n$--.

In the Claims

Claim 1, Column 16, Line 23:
Delete the phrase "1.5 atoms/nm3" and replace with --1.5 atoms/nm$^3$--.

Signed and Sealed this
Twenty-sixth Day of March, 2019

Andrei Iancu
*Director of the United States Patent and Trademark Office*